United States Patent
Gau et al.

(10) Patent No.: US 6,670,695 B1
(45) Date of Patent: Dec. 30, 2003

(54) METHOD OF MANUFACTURING ANTI-REFLECTION LAYER

(75) Inventors: Jing-Horng Gau, Hsinchu Hsien (TW); Shuenn-Jeng Chen, Tainan Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/515,811

(22) Filed: Feb. 29, 2000

(51) Int. Cl.[7] .................. H01L 23/58; H01L 21/469
(52) U.S. Cl. .................. 257/649; 438/786; 257/639; 257/646
(58) Field of Search .................. 257/646–649, 257/375, 411; 438/680, 765, 769–778, 786–794

(56) References Cited

U.S. PATENT DOCUMENTS

| | | | | |
|---|---|---|---|---|
| 5,821,153 A | * | 10/1998 | Tsai et al. .................. | 438/439 |
| 5,939,763 A | * | 8/1999 | Hao et al. .................. | 257/411 |
| 5,977,601 A | * | 11/1999 | Yang et al. .................. | 257/437 |
| 5,989,957 A | * | 11/1999 | Ngo et al. .................. | 438/257 |
| 6,100,559 A | * | 8/2000 | Park .................. | 257/315 |
| 6,204,182 B1 | * | 3/2001 | Truninger et al. .................. | 438/691 |
| 6,207,587 B1 | * | 3/2001 | Li et al. .................. | 438/769 |
| 6,440,870 B1 | * | 8/2002 | Nallan et al. .................. | 438/734 |

* cited by examiner

*Primary Examiner*—Matthew Smith
*Assistant Examiner*—Calvin Lee
(74) *Attorney, Agent, or Firm*—J.C. Patents

(57) ABSTRACT

An anti-reflection layer and method of manufacture. A silicon substrate has a conductive layer formed thereon. Plasma-enhanced chemical vapor deposition is performed to form a graded silicon oxynitride layer over the conductive layer. During silicon oxynitride deposition, concentration of one of the reactive gases nitrous oxide is gradually reduced so that the graded silicon oxynitride layer is oxygen-rich near bottom but nitrogen-rich near the top.

8 Claims, 3 Drawing Sheets

METHOD OF MANUFACTURING ANTI-REFLECTION LAYER

BACKGROUND OF THE INVENTION

1. Field of the Invention

The present invention relates to an anti-reflection layer for semiconductor integrated circuit. More particularly, the present invention relates to a silicon oxynitride ($SiO_{2x}N_y$) anti-reflection layer and its method of manufacture.

2. Description of the Related Art

The integrated circuit patterns of a semiconductor chip are formed by transferring the desired pattern from a photomask to a photoresist layer through light exposure and subsequent photoresist development. In general, light that passes through the unblocked regions of a photomask will cause a photochemical reaction in the photoresist material. The reacted photoresist material is next removed in a photoresist development to reproduce the photomask pattern on the photoresist layer. However, due to variations in local topography of a silicon chip, the photoresist layer is unlikely to have a uniform thickness or uniform reflectivity to light. When the photoresist layer is exposed to light, incoming light may interfere with light reflected from the photoresist/substrate interface. Consequently, what are known as reflective notches are often formed in some regions of the transferred pattern, leading to errors in device line width or feature misalignment.

To reduce device line width, light source of very short wavelength is now used in new generation optical exposure systems. However, a shorter wavelength light beam has greater reflectivity at the photoresist/chip interface, causing larger deviations in the resulting photoresist pattern. In addition, as intensity level of back-reflected light is increased, accuracy of the pattern is harder to control. Such instability of resulting pattern is easily observed when a polysilicon gate or a layer with a highly reflective underlying medium such as aluminum is patterned. Hence, constrained by small line width and high reflectivity, high fidelity pattern transfer in a photolithographic operation proves difficult to obtain.

SUMMARY OF THE INVENTION

Accordingly, one object of the present invention is to provide an anti-reflection layer capable of reducing the intensity of reflected light from a reflective surface. Hence, errors in transferred pattern due to interference of incoming and reflected light are minimized. In addition, a wider window of depth of focus (DOF) for a photoresist layer can be obtained so that precision and resolution of a pattern transfer is raised.

To achieve these and other advantages and in accordance with the purpose of the invention, as embodied and broadly described herein, the invention provides an anti-reflection layer having a composite structure. The composite anti-reflection structure includes an oxygen-rich silicon oxynitride layer, a nitrogen-rich silicon oxynitride layer and a stack of silicon oxynitride layers. Oxygen content in each silicon oxynitride layer is lower than the oxygen-rich silicon oxynitride layer while nitrogen content of each silicon oxynitride layer is lower than the nitrogen-rich oxynitride layer. In addition, among the stack of silicon oxynitride layers, the layer closest to the oxygen-rich silicon oxynitride layer has the highest oxygen content. Similarly, among the stacks of silicon oxynitride layers, the layer closest to the nitrogen-rich silicon oxynitride layer has the highest nitrogen content.

The invention also provides a method of forming the anti-reflection layer. The method includes depositing silicon oxynitride over a reflective surface in a reacting chamber using silane, ammonia and nitrous oxide as reactive gases in a plasma-enhanced chemical vapor deposition. A constant flow of silane and ammonia is maintained in the reaction chamber throughout the reaction. Flow rate of nitrous oxide is varied such that the flow rate drops from 2 liters per minute at the beginning of the reaction to almost zero near the end of the reaction. Hence, oxygen content in the deposited silicon oxynitride layer will drop while nitrogen content in the deposited silicon oxynitride layer will increase as the reaction progresses. In other words, while an oxygen-rich silicon oxynitride layer is formed at the bottom while a nitrogen-rich silicon oxynitride layer is formed at the top such that oxygen and nitrogen content of the intermediate layers changes gradually.

The silicon oxynitride structure in the embodiment of this invention is oxygen-rich at the bottom and nitrogen-rich at the top. Between the oxygen-rich bottom layer and the nitrogen-rich top layer is silicon oxynitride material having a gradually varying amount of oxygen and nitrogen. Hence, the silicon oxynitride structure can be regarded as a stack of silicon oxynitride layers, each having a different oxygen/nitrogen ratio and hence a slightly different physical property. The stack of silicon oxynitride layers can prevent back reflection of light because light will be reflected and refracted differently by each layer. After several reflections and refractions, intensity of back-reflected light is reduced to a negligible level. Furthermore, through multiple reflections and refractions, the depth of focus window is increased so that the ultimate resolution of the photoresist layer is also increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
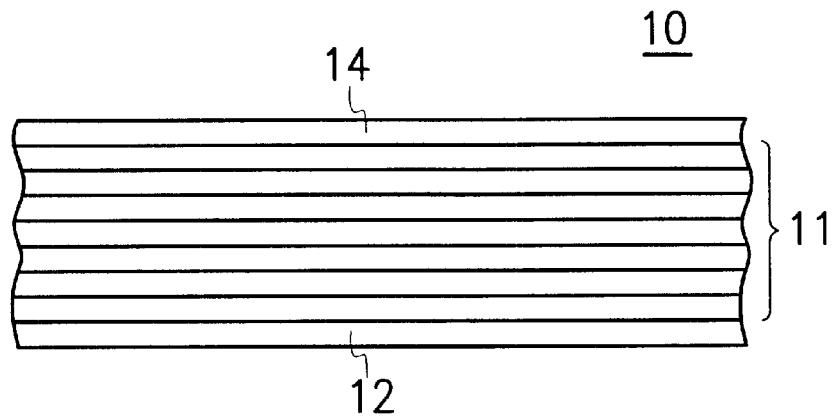
FIG. 1 is a cross-sectional side view of a graded silicon oxynitride structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a cross-sectional side view of a graded silicon oxynitride structure according to one preferred embodiment of this invention. As shown in FIG. 1, the graded silicon oxynitride structure 10 actually includes a nitrogen-rich silicon oxynitride layer, top layer 14, an oxygen-rich silicon oxynitride layer, bottom layer 12, and a stack of silicon oxynitride layers 11 between the top layer 14 and the bottom layer 12. Oxygen content inside the nitrogen-rich silicon oxynitride layer 14 is small, and so the nitrogen-rich silicon oxynitride layer 14 has properties very similar to a silicon nitride layer. Nitrogen content inside the oxygen-rich silicon oxynitride layer 12 is small, and so the oxygen-rich silicon oxynitride layer has properties very similar to a silicon oxide layer. The amount of oxygen and nitrogen inside each silicon oxynitride layer of the stack 11 varies from layer to layer. In general, the silicon oxynitride layer closest to the oxygen-rich silicon oxynitride layer 12 has the highest oxygen content. Similarly, the silicon oxynitride layer closest to the nitrogen-rich silicon oxynitride layer 14 has the highest nitrogen content. However, the oxygen content of all these silicon oxynitride layers is smaller than the oxygen-rich silicon oxynitride layer 12. Similarly, the nitrogen content of all these silicon oxynitride layers is smaller than the nitrogen-rich silicon oxynitride layer 14.

The graded silicon oxynitride structure 10 is formed, for example, by carrying out a plasma-enhanced chemical vapor deposition in a reaction chamber using silane, ammonia and nitrous oxide as reactive gases.

At the beginning of the reaction, flow rate of the nitrous oxide is maintained at 2 liters per minute. As the reaction progresses, flow rate of the nitrous oxide is reduced until it is zero near the end of the reaction. The flow of silane and ammonia is maintained at a constant rate of 150 $cm^3$ per minute and 2 liters per minute, respectively, throughout the reaction process. The earliest-formed layer of the graded silicon oxynitride structure 10 has the highest oxygen content because the greatest amount of nitrous oxide is channeled into the reaction chamber at the beginning. Hence, the bottom layer becomes an oxygen-rich silicon oxynitride layer 12. Since the amount of nitrous oxide flowing into the reaction chamber is gradually reduced as deposition of silicon oxynitride material progresses, nitrogen content of the silicon oxynitride layer in the stack 11 keeps increasing. The uppermost layer formed just before the end of the reaction has the greatest amount of nitrogen. Hence, the uppermost layer becomes a nitrogen-rich silicon oxynitride layer 14.

To compare the reflectivity between graded silicon oxynitride ($SiO_{2x}N_y$) layer and conventional silicon oxynitride (SiON) layer, graded and conventional silicon oxynitride layers are formed at five different locations on a silicon chip next to each other. Measurement shows that the graded silicon oxynitride structure has an average reflectivity of about 0.2473 while conventional silicon oxynitride layer has an average reflectivity of about 0.3188. Hence, forming a graded silicon oxynitride layer over a substrate layer is an effective means of reducing most back reflections.

The following are examples illustrating a few applications of the graded silicon oxynitride structure in the manufacture of semiconductors.

Figure 2A:
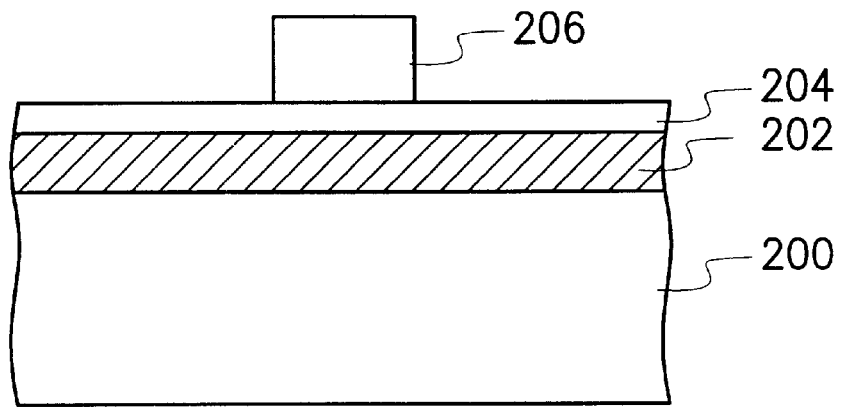
FIGS. 2A and 2B are cross-sectional views showing the steps for forming a metal line over a semiconductor substrate according to this invention.
Figure 2B:
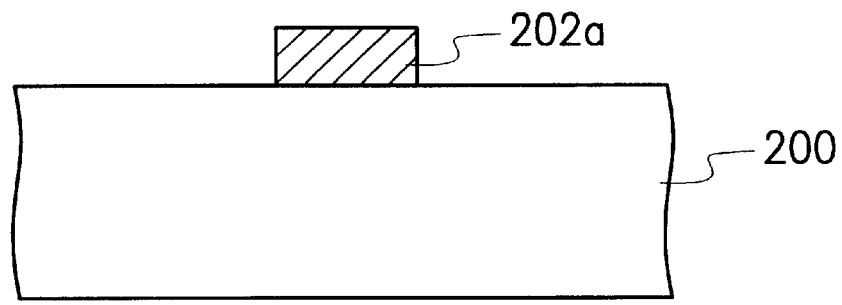

FIGS. 2A and 2B are cross-sectional views showing the steps for producing a metal line over a semiconductor substrate according to the invention. As shown in FIG. 2A, a conductive layer such as a metallic layer 202 is formed over a silicon substrate 200. A graded silicon oxynitride layer 204 of this invention is next formed over the metallic layer 202. The graded silicon oxynitride layer 204 serves as an anti-reflection layer preventing the back reflections of light from the metallic surface so that an error-free pattern is transferred. A photoresist layer 206 is formed over the graded silicon oxynitride layer 204, and then the photoresist layer 206 is patterned by light exposure and subsequent development. As shown in FIG. 2B, the graded silicon oxynitride layer 204 and the metallic layer 202 are etched to form a metallic line 202a using the patterned photoresist layer 206 as a mask. Finally, the patterned photoresist layer 206 is removed.

Figure 3A:
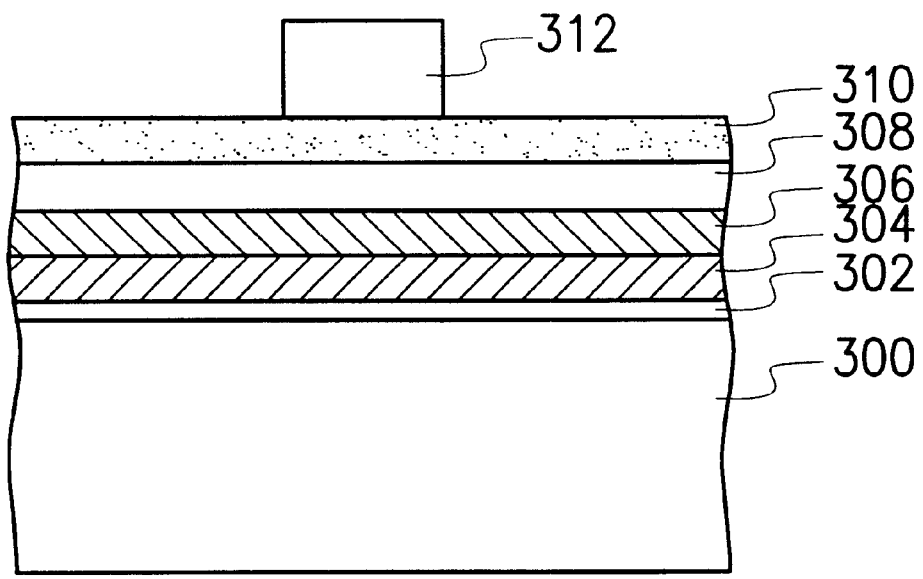
FIGS. 3A and 3B are cross-sectional views showing the steps for forming the polysilicon gate of a MOS transistor according to the invention.
Figure 3B:
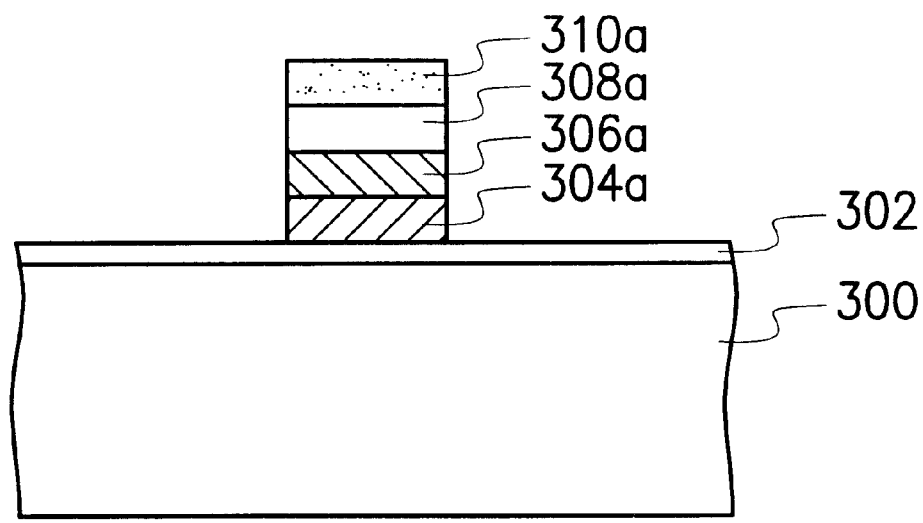

FIGS. 3A and 3B are cross-sectional views showing the steps for forming the polysilicon gate of a MOS transistor according to the invention. As shown in FIG. 3A, an oxide layer 302, a polysilicon layer 304, a tungsten silicide layer 306, the graded silicon oxynitride layer 308 of this invention and a silicon nitride layer 310 are sequentially formed over a silicon substrate 300. A photoresist layer 312 is formed over the silicon nitride layer 310, and then the photoresist layer 312 is patterned. As shown in FIG. 3B, the silicon nitride layer 310, the graded oxynitride layer 308, the tungsten silicide layer 306 and the polysilicon layer 304 are etched to form a gate that includes four layers 304a, 306a, 308a and 310a while using the patterned photoresist layer 312 as a mask. Finally, the patterned photoresist layer 312 is removed. In a conventional method of forming a gate, no graded silicon oxynitride layer is formed between the silicon nitride layer 310 and the tungsten silicide layer 306. Hence, cohesion of the two layers is poor. Furthermore, due to the presence of uneven stress at the interface of the two layers, peeling of the silicon nitride layer often occurs. In this invention, the graded silicon oxynitride layer 308 not only can serve as an anti-reflection layer for transferring a pattern to the photoresist layer, but can also release a portion of the stress in the silicon nitride layer 310. Since the uppermost portion of the silicon oxynitride layer 308 is a nitrogen-rich silicon oxynitride material, adhesion with the overlying silicon nitride layer 310 is good. Similarly, since the bottom portion of the silicon oxynitride layer 308 is an oxygen-rich oxynitride material, adhesion with the underlying tungsten silicide layer is good.

Figure 4A:
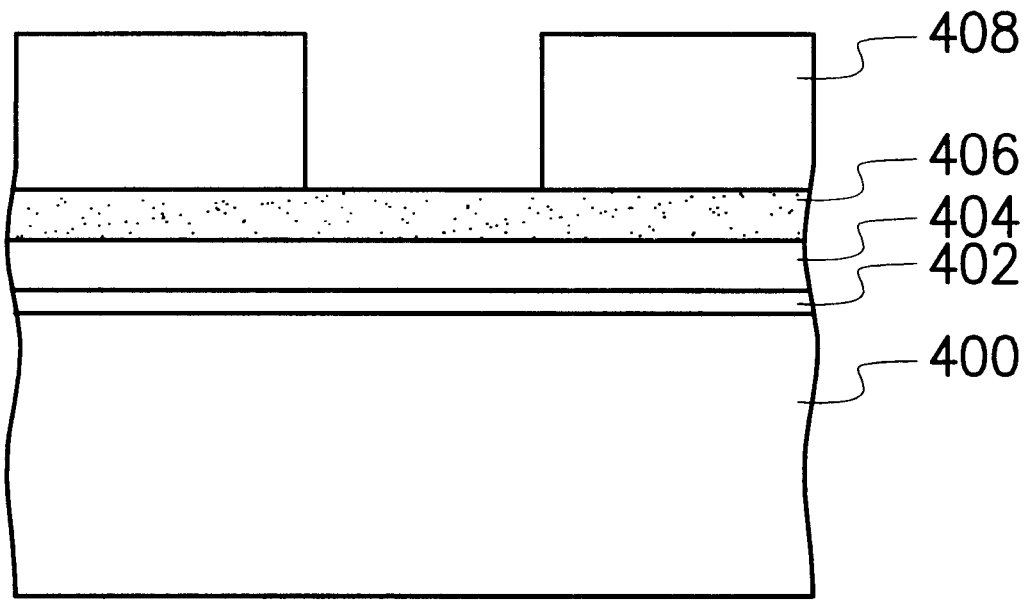
FIGS. 4A and 4B are cross-sectional views showing the steps for forming a shallow trench isolation region on a substrate according to the invention.
Figure 4B:
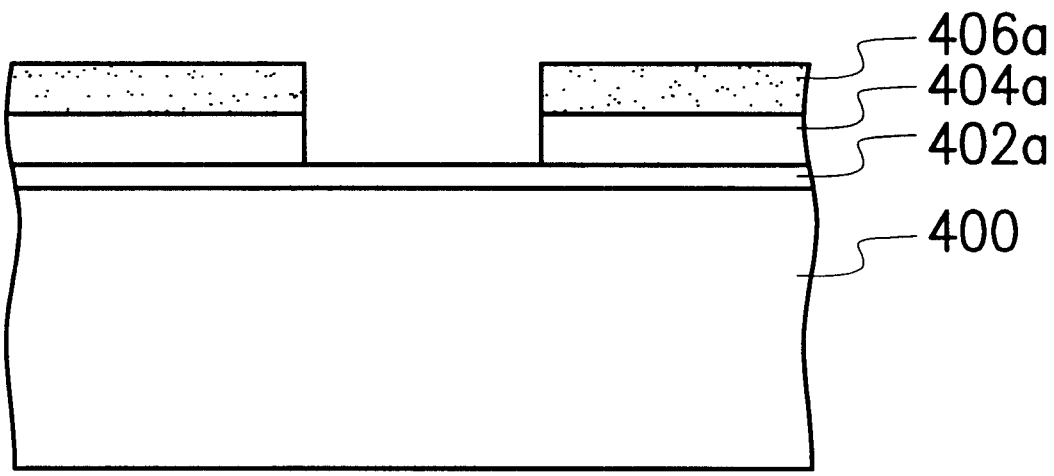

FIGS. 4A and 4B are cross-sectional views showing the steps for forming a shallow trench isolation region on a substrate according to the invention. As shown in FIG. 4A, an oxide layer 402, the graded silicon oxynitride layer 404 of this invention and a silicon nitride layer 406 are sequentially formed over a silicon substrate 400. A photoresist layer 408 is formed over the silicon nitride layer 406, and then the photoresist layer 408 is patterned. As shown in FIG. 4B, the silicon nitride layer 406 and the graded silicon oxynitride layer 404 are etched to form a trench through the layers 404a and 406a while using the patterned photoresist layer 408 as a mask. Finally, the patterned photoresist layer 408 is removed. Similarly, the graded silicon oxynitride layer 404 of this invention not only serves as an anti-reflection layer, but also serves as a medium for releasing a portion of the stress with adjacent silicon nitride layer 406. Hence, peeling of the silicon nitride layer 406 is prevented.

The graded silicon oxynitride structure in this invention can be regarded as a stack of silicon oxynitride layers each having a slightly different nitrogen/oxygen content. In fact, each of the silicon oxynitride layers reflects and refracts a portion of the incoming light. Multiple reflection and refraction of incoming light by the stack of silicon oxynitride layers reduces the intensity of back reflections to a negligible level. Through multiple reflections and refractions, the depth of focus (DOF) window for a photoresist layer is also increased. Hence, accuracy of pattern transfer is improved and resolution of the post-development photoresist layer is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A polysilicon gate of a MOS transistor, comprising:
    an oxide layer, over a silicon substrate;
    a polysilicon layer, over the oxide layer;
    a tungsten silicide layer, over the polysilicon layer;
    a graded silicon oxynitride layer, over the tungsten silicide layer, wherein the graded silicon oxynitride layer, comprising:
        an oxygen-rich silicon oxynitride layer;
        a nitrogen-rich silicon oxynitride layer; and
        a stack of silicon oxynitride layers between the oxygen-rich silicon oxynitride layer and the nitrogen-rich silicon oxynitride layer, wherein a silicon oxynitride layer in the stack closest to the oxygen-rich silicon oxynitride layer has a highest oxygen concentration and a silicon oxynitride layer in the stack closest to the nitrogen-rich silicon oxynitride layer has a highest concentration of nitrogen; and a silicon nitride layer, over the graded oxynitride layer.

2. The polysilicon gate of claim 1, wherein the oxygen-rich silicon oxynitride layer, the nitrogen-rich silicon oxynitride layer and the stack of silicon oxynitride layers are formed by a plasma-enhanced chemical vapor deposition.

3. The polysilicon gate of claim 1, wherein the plasma-enhanced chemical vapor deposition uses silane, ammonia and nitrous oxide as reactive gases.

4. The polysilicon gate of claim 1, wherein the layered structure of the anti-reflection layer is formed by maintaining a constant flow rate of silane and ammonia while varying a flow rate of the nitrous oxide in the plasma-enhanced chemical vapor deposition.

5. A shallow trench isolation region on a substrate, comprising:
    an oxide layer, over the substrate;
    a graded silicon oxynitride layer with a trench, over the oxide layer, wherein the graded silicon oxynitride layer with a, comprising:
        an oxygen-rich silicon oxynitride layer;
        a nitrogen-rich silicon oxynitride layer; and
        a stack of silicon oxynitride layers between the oxygen-rich silicon oxynitride layer and the nitrogen-rich silicon oxynitride layer, wherein a silicon oxynitride layer in the stack closest to the oxygen-rich silicon oxynitride layer has a highest oxygen concentration and a silicon oxynitride layer in the stack closest to the nitrogen-rich silicon oxynitride layer has a highest concentration of nitrogen; and a silicon nitride layer, on the graded oxynitride layer.

6. The shallow trench isolation region of claim 5, wherein the oxygen-rich silicon oxynitride layer, the nitrogen-rich silicon oxynitride layer and the stack of silicon oxynitride layers are formed by a plasma-enhanced chemical vapor deposition.

7. The shallow trench isolation region of claim 5, wherein the plasma-enhanced chemical vapor deposition uses silane, ammonia and nitrous oxide as reactive gases.

8. The shallow trench isolation region of claim 5, wherein the layered structure of the anti-reflection layer is formed by maintaining a constant flow rate of silane and ammonia while varying a flow rate of the nitrous oxide in the plasma-enhanced chemical vapor deposition.

* * * * *